United States Patent [19]
Kita et al.

[11] Patent Number: 4,606,995
[45] Date of Patent: Aug. 19, 1986

[54] PROCESS FOR DEVELOPING LIGHT-SENSITIVE O-QUINONEDIAZIDE LITHOGRAPHIC PLATES WITH DEVELOPING SOLUTION HAVING COBALT OR NICKEL COMPOUND

[75] Inventors: Nobuyuki Kita; Hiroshi Matsumoto; Hitoshi Hagiwara, all of Shizuoka, Japan

[73] Assignee: Fuji Photo Film Company, Limited, Kanagawa, Japan

[21] Appl. No.: 566,454

[22] Filed: Dec. 28, 1983

[30] Foreign Application Priority Data

Dec. 28, 1982 [JP] Japan ................................. 57-229847

[51] Int. Cl.$^4$ ................................................ G03F 7/08
[52] U.S. Cl. .................................... 430/302; 430/191; 430/192; 430/165; 430/309; 430/326
[58] Field of Search ............... 430/302, 309, 326, 278, 430/936

[56] References Cited

U.S. PATENT DOCUMENTS

| 3,201,241 | 8/1965 | Munder et al. | 430/302 |
| 3,615,480 | 10/1971 | Lam | 430/309 |
| 3,970,458 | 7/1976 | Bissonette | 430/936 |
| 4,292,388 | 9/1981 | Ikeda et al. | 430/299 |
| 4,292,395 | 9/1981 | Wada et al. | 430/299 |
| 4,314,022 | 2/1982 | Fisch | 430/278 |
| 4,374,920 | 2/1983 | Wanat et al. | 430/309 |
| 4,469,776 | 9/1984 | Matsumoto et al. | 430/309 |

Primary Examiner—Charles L. Bowers, Jr.
Attorney, Agent, or Firm—Sughrue, Mion, Zinn, Macpeak, and Seas

[57] ABSTRACT

A developing solution for developing a light-sensitive lithographic plate having a o-quinonediazide compound-containing light-sensitive layer is disclosed. The developing solution is comprised of an aqueous solution containing alkali silicate and an alkali aqueous solution-soluble compound of a metal selected from the group consisting of Sn, Pb, Fe, Co and Ni. The developing solution provides excellent resolving power, has excellent development stability, processing capability and adaptability with respect to automatic developing machines.

5 Claims, No Drawings

PROCESS FOR DEVELOPING LIGHT-SENSITIVE O-QUINONEDIAZIDE LITHOGRAPHIC PLATES WITH DEVELOPING SOLUTION HAVING COBALT OR NICKEL COMPOUND

FIELD OF THE INVENTION

This invention relates to an improved developing solution for developing light-sensitive lithographic plates containing a o-quinonediazide compound as a light-sensitive component (hereinafter referred to as "PS plates").

BACKGROUND OF THE INVENTION o-Quinonediazide compounds are known to undergo, when irradiated with actinic light, decomposition of the diazo group, forming carboxy group-containing compounds. Therefore, when imagewise exposed and processed with an alkaline developing solution, exposed portions of a light-sensitive layer containing o-quinonediazide compounds are removed. Accordingly the unexposed portions form an image. Thus, the o-quinonediazide compounds have recently been extremely widely used as a so-called positive working light-sensitive component in a light-sensitive PS plate or in a photoresist composition used in photoetching. In particular, a composition prepared by mixing a o-quinonediazide compound with an alkali-soluble resin has been advantageously employed from the stand points of economical and practical merits. Above all, a resin composition prepared by mixing a o-quinonediazide compound with a novolak type phenol-formaldehyde condensate resin or cresol-formaldehyde condensate resin has been popularly used.

Useful developing agents for developing light-sensitive layers containing these o-quinonediazides include aqueous solutions containing sodium tertiary phosphate, sodium hydroxide, sodium silicate, potassium silicate, ammonium silicate, etc. alone or in combination. However, an aqueous solution of sodium hydroxide, sodium tertiary phosphate or the like can exert a strong etching action on a metal such as aluminum depending upon the developing time, thus being inconvenient for developing light-sensitive materials having a metal support. In addition, such aqueous solutions provide extremely varied development results and, in extreme cases, images can be removed by only a slight protraction of developing time. Further, they undergo so much deterioration of developing ability when repeatedly used that the amount of light-sensitive materials processable with a definite volume of the solution (processing capability) is very small. Accordingly, an aqueous solution of sodium silicate or potassium silicate has recently been used with comparative advantages. Because, they exert only a small etching effect on metals and, at the same time, their developing ability can be controlled to some extent by adjusting the ratio of silicone oxide ($SiO_2$) to sodium oxide ($Na_2O$) or potassium oxide ($K_2O$) (generally presented as a molar ratio of $SiO_2/Na_2O$ or $SiO_2/K_2O$), with the silicone oxides being ingredients of sodium silicate or potassium silicate, and adjusting the concentration thereof. That is, as the content of $SiO_2$ increases, there results a more suppressed developing ability, with development stability being increased, whereas as the content of $Na_2O$ or $K_2O$ increases, developing ability is increased with development stability being decreased. The phrase "development stability" as used herein means stability of image versus developing time. As the content of only $Na_2O$ or $K_2O$ increases, removal of the image is liable to take place in a short time.

Processing capability of a definite volume of the developing solution becomes higher as the content of $Na_2O$ or $K_2O$ increases. Therefore, moderate processing capability can be obtained together with a certain degree of developing ability and stability by raising the total concentration while adjusting the $SiO_2/Na_2O$ or $SiO_2/K_2O$ ratio in view of developing ability and development stability. However, this is still insufficient for satisfying both of the requirements: if developing ability is satisfactory, there results insufficient stability and, if stability is satisfactory, there results insufficient developing ability and processing capability. In addition, since a comparatively high concentration is employed, a precipitate is easily formed, and a large amount of acid must be used for neutralizing a waste liquor. The problems with the above-described developing solutions containing sodium hydroxide, sodium tertiary phosphate, sodium silicate, potassium silicate or the like are summerized as follows: Increased alkaline strength leads to insufficient development stability though developing ability and processing capability are increased and, in order to obtain sufficient stability, the alkali concentration must be decreased, which results in insufficient processing capability. Therefore, if sufficient development stability is obtained while maintaining high alkaline strength, there can be obtained a developing solution having excellent developing ability and processing capability. As a process for obtaining sufficient development stability with high alkali strength, Japanese Patent Application (OPI) No. 51324/75 describes adding an anionic or amphoteric surfactant to a developing solution, Japanese Patent Application (OPI) No. 95946/80 describes adding a water-soluble cationic polymer, and Japanese Patent Application (OPI) No. 142528/81 describes adding a water-soluble amphoteric high polymer electrolyte. However, these developing solutions have the defect that, when development is conducted in an automatic developing machine, the developing solutions are liable to foam during development. In addition, Japanese Patent Application (OPI) No. 25100/80 corresponding to Canadian Patent No. 1,145,190 describes adding an ionic compound of a transition element of the group IIA, IIIA or IIIB of the periodic table. Although this addition is effective for suppressing etching of anodized aluminum support with a strong alkali, it fails to attain development stability.

SUMMARY OF THE INVENTION

It is, therefore, an object of the present invention to provide a developing solution which provides excellent resolving power and which has excellent development stability, processing capability, and adaptability to automatic developing machines.

As a result of intensive investigations to attain the above-described object, the inventors have found that a developing solution capable of developing a o-quinonediazide light-sensitive layer can be obtained by incorporating at least one alkali aqueous solution-soluble compound of a metal selected from the group consisting of Sn, Pb, Fe, Co and Ni in an alkali silicate aqueous solution.

DETAILED DESCRIPTION OF THE INVENTION

As the alkali silicate to be used in the present invention, sodium silicate, potassium silicate, lithium silicate, ammonium silicate, etc. may be used alone or in combination. Of the alkali silicates, sodium silicate and potassium silicate are preferably used and potassium silicate is most preferably used. The $SiO_2/M_2O$ (M: alkali metal or ammonium) molar ratio of the alkali silicate preferably ranges from 0.5 to 3.0, more preferably from 1.0 to 2.0. As the above-described molar ratio increases beyond 3.0, developing ability decreases and, as the molar ratio decreases below 0.5, alkaline strength is increased so much that there is a problem with respect to etching the aluminum plate or the like which is used as the support of the presensitized lithographic plate. The concentration of an alkali silicate in the developing solution preferably ranges from 1 to 10 wt %, more preferably from 1.5 to 7 wt %. As the concentration increases beyond 10 wt %, precipitates or crystals are liable to be formed and gelation takes place upon neutralization of a waste liquor.

On the other hand, as compounds of metals selected from among Sn, Pb, Fe, Co, and Ni, which are the most characteristic ingredients to be used in the present invention, any alkali aqueous solution-soluble ones can be used. More preferable compounds are selected from complexes of the metals. As the ligands forming such complexes, there are illustrated unidentate ligands such as $NH_3$, $OH_2$, $NO^-$, $NO_2^-$, $NO_3^-$, $CN^-$, $SCN^-$, $Br^-$, $Cl^-$, $F^-$, $I^-$, $CO_2$, $CO$, etc. and polydentate ligands such as ethylenediamine, $C_2O_4^{2-}$, $HONC(CH_3)=C(CH_3)NO$, $OC(NH_2)_2$, $NH_2CH_2COO^-$, ethylenediaminetetraacetic acid, diethylenetriamine, triethylenetetramine, bipyridine, 1,10-phenanthroline, diethylenetriaminepentaacetic acid, triethylenetraminehexaacetic acid, hydroxyethylethylenediaminetriacetic acid, nitrilotriacetic acid, 1,2-diaminocyclohexanetetraacetic acid, 1,3-diaminocyclohexanetetraacetic acid, 1,3-diamino-2-propanoltetraacetic acid, and organic phosphonic acids (e.g., 2-phosphonobutane-1,2,4-tricarboxylic acid, aminotri(methylenephosphonic acid), 1-hydroxyethylidene-1,1-diphosphonic acid, 3,3-diphosphonopimelic acid, $(PO_3H_2)NCH_2CH_2N-(CH_2PO_3H_2)_2$, $N(CH_2PO_3H_2)_3$, etc.). Specific examples thereof include $[Co(NH_3)_6]Cl_3$, $[Fe(NH_3)_6]I_2$, $[Ni(NH_3)_6]Cl_2$, $[Co(H_2NCH_2CH_2NH_2)_3]Cl_3$, $[Co(NH_3)_6]PO_4$, $[Co(NH_3)_6](H_2PO_4)_3$, $[Fe(NH_3)_6](HPO_4)_2$, $[Ni(NH_3)_5Cl]Cl$, $[Co(CN)(NH_3)_5]Cl_2$, $[Co(SCN)(NH_3)_5]Cl_2$, $[Co(NO_3)(NH_3)_5]Cl_2$, $[Co(SO_3)(NH_3)_5]Cl$, $[Co(NO_2)(NH_3)_5]Cl_2$, $[Co(OH_2)(NH_3)_5]Cl_3$, $K_3[Co(CN)_6]$, $[Co(NH_3)_4Cl_2]Cl$, $[Fe(NH_3)_5NO_2]Cl_2$, $[Co(CH_3COO)_2].4H_2O$, $K[Co(edta)]$, $Na[CO(edta)]$, $(NH_4)[Co(edta)]$, $K_3[CoCl_6]$, $Na_3[CoBr_6]$, $K[Co(H_2NCH_2CH_2NH_2)(NO_2)_4]$, $K_3[Ni(C_2O_4)_3]$, $K_2[Ni(edta)]$, $Na_2[Ni(edta)]$, $K_2[Fe(edta)]$, $Na[Fe(edta)]$, $(NH_4)[Fe(edta)]$, $K_3[Fe(C_2O_4)_3]$, $Na_3[Fe(C_2O_4)_3]$, $PbCl_4$, $K_2[PbCl_6]$, $Pb(CH_3COO)_4$, $Pb(edta)$, $[Pb_6O(OH)_6]Cl_4$, etc. Above all, aminopolycarboxylic acid and Co are most preferable ligand and metal respectively, for forming complexes. With these specific examples, "edta" stands for ethylenediaminetetraacetic acid radical. These examples can be obtained by known synthesizing processes or are commercially available.

The alkali aqueous solution-soluble metal compounds described above are incorporated in the developing solution suitably in a content of about 0.005 to about 0.2 wt %, more preferably 0.01 to 0.1 wt %, based on the total weight of the developing solution.

The PS plate to which the developing solution of the present invention is applied comprises a support with a hydrophilic surface having provided thereon a light-sensitive layer comprising a o-quinonediazide compound. Preferable examples of the support include pure aluminum plates, aluminum alloy plates, and plastic films having aluminum laminated or deposited thereon. The surface of the aluminum plate has been preferably subjected to such surface treatment as graining treatment, dipping treatment in an aqueous solution of sodium silicate, potassium fluorozirconate, phosphoric salt, or the like, or anodizing treatment. In addition, an aluminum plate having been dipped in an aqueous solution of sodium silicate after being grained as described in U.S. Pat. No. 2,714,066 and an aluminum plate having been dipped in an aqueous solution of alkali metal silicate after being anodized as described in U.S. Pat. No. 3,181,461 are also preferable. The above-described anodizing treatment is effected by conducting a current in an aqueous solution or non-aqueous solution of inorganic acids such as phosphoric acid, chromic acid, sulfuric acid, boric acid, etc. or organic acids such as oxalic acid, sulfamic acid, etc. or the salts thereof, alone or in a combination of two or more using the aluminum plate as an anode.

Also, electrodeposition of silicate as described in U.S. Pat. No. 3,658,662 is effective.

Further, those which have been anodized as described above after being electrolytically grained as disclosed in U.S. Pat. No. 4,087,341, Japanese Patent Publication No. 27481/71 corresponding to U.S. Pat. No. 4,115,128, and Japanese Patent Application (OPI) No. 30503/77 are also useful. Still further, aluminum plates having been grained, chemically etched, and then anodized as described in U.S. Pat. No. 3,834,998 are also preferable.

These treatments for rendering the aluminum surface hydrophilic are conducted for various purposes, such as preventing harmful reaction with a light-sensitive composition to be provided thereon and improving adhesiveness for a light-sensitive layer as well as rendering the support surface hydrophilic.

A light-sensitive layer to be provided on the hydrophilic surface of the support is comprised of a o-quinonediazide compound. Particularly preferable o-quinonediazide compounds are o-naphthoquinonediazide compounds which are described in many publications including U.S. Pat. Nos. 3,046,110, 3,046,111, 3,046,121, 3,046,115, 3,046,118, 3,046,119, 3,046,120, 3,046,121, 3,046,122, 3,046,123, 3,061,430, 3,102,809, 3,106,465, 3,635,709, and 3,647,443. Of these, o-naphthoquinonediazido-sulfonic acid esters or o-naphthoquinonediazidocarboxylic acid esters of aromatic hydroxy compounds, and o-naphthoquinonediazido-sulfonic acid amide or o-naphthoquinonediazido-carboxylic acid amides of aromatic amino compounds are preferable. In particular, an esterification product of o-naphthoquinonediazido-sulfonic acid with a pyrogallol-acetone condensate described in U.S. Pat. No. 3,635,709, an esterification product of o-naphthoquinonediazidosulfonic acid or o-naphthoquinonediazido-carboxylic acid with polyester having terminal hydroxy groups described in U.S. Pat. No.

4,028,111, an esterification product of o-naphthoquinonediazido-sulfonic acid or o-naphthoquinonediazidocarboxylic acid with a p-hydroxystyrene homopolymer or a copolymer of p-hydroxystyrene and other copolymerizable monomer as described in British Patent No. 1,494,043, and an amidation reaction product of o-naphthoquinonediazido-sulfonic acid or o-naphthoquinonediazido-carboxylic acid with a copolymer of p-aminostyrene and other copolymerizable monomers are extremely excellent.

These o-quinonediazide compounds may be used independently but, preferably, they are used in combination with an alkali-soluble resin to form a light-sensitive layer. Preferable alkali-soluble resins include novolak type phenol resins, specifically, phenol-formaldehyde resin, o-cresol-formaldehyde resin, m-cresol-formaldehyde resin, etc. Further, combined use of a condensate of phenol or cresol substituted by an alkyl group containing 3 to 8 carbon atoms and formaldehyde, such as t-butylphenolformaldehyde resin and the above-described phenol resin is more preferable as described in Japanese Patent Application (OPI) No. 125806/75 corresponding to U.S. Pat. No. 4,123,279. The alkali-soluble resin is incorporated in a content of about 50 to about 85 wt %, preferably 60 to 80 wt %, based on the total weight of the light-sensitive layer.

The light-sensitive layer comprising the o-quinonediazide compound may contain, if necessary, dyes, plasticizers, and compounds capable of imparting print-out ability.

Dyes are used for establishing contrast between image areas and non-image areas (support surface) on a PS plate after imagewise exposure and subsequent development. Preferable examples thereof include alcohol-soluble dyes such as C.I. 26,105 (Oil Red RR), C.I. 21,260 (Oil Scarlet #308), C.I. 74,350 (Oil Blue), C.I. 52,015 (Methylene Blue), C.I. 42,555 (Crystal Violet), etc. These dyes are added in amounts necessary for establishing distinct contrast between the color of the hydrophilic surface laid bare by the imagewise exposure and subsequent development of the light-sensitive plate and the color of remaining areas of the light-sensitive layer and, generally, they are added within a range of not exceeding about 7 wt % based on the total weight of the light-sensitive composition.

Plasticizers are effective for a light-sensitive layer provided on a support to possess desired flexibility and, for example, phthalates such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diaryl phthalate, etc., glycol esters such as dimethylglycol phthalate, ethylphthalylethyl glycolate, methylphthalylethyl glycolate, butylphthalylbutyl glycolate, triethylene glycol dicaprylate, etc., phosphates such as tricresyl phosphate, triphenyl phosphate, etc., aliphatic dibasic acid esters such as diisobutyl adipate, dioctyl adipate, dimethyl sebacate, dibutyl sebacate, dioctyl azelate, dibutyl maleate, etc., polyglycidyl methacrylate, triethyl citrate, glycerin triacetyl ester, butyl laurate, etc. are effective.

These plasticizers are incorporated in a content of about 5 wt % or less based on the total weight of the light-sensitive composition.

Print-out materials are those which make it possible to view images immediately after imagewise exposure of a PS plate. For example, there are illustrated pH indicators as described in BP No. 1,041,463, a combination of o-naphthoquinonediazido-4-sulfonyl chloride and a dye as described in U.S. Pat. No. 3,969,118, and photochromic compounds described in Japanese Patent Publication No. 6413/69. Further, as is disclosed in Japanese Patent Application (OPI) No. 80022/77 corresponding to U.S. Pat. No. 4,115,128, sensitivity can be increased by adding a cyclic acid anhydride to a light-sensitive layer.

The light-sensitive composition comprising such o-naphthoquinonediazide is coated on a support as a solution of a suitable solvent. Suitable solvents include glycol ethers such as ethylene glycol monomethyl ether, ethylene glycol monoethyl ether, 2-methoxyethyl acetate, etc., ketones such as acetone, methyl ethyl ketone, cyclohexanone, etc., and chlorinated hydrocarbons such as ethylene dichloride.

The light-sensitive layer comprising the o-quinonediazide compound is coated on a support in a coating amount of about 0.5 to about 7 $g/m^2$, more preferably 1.5 to 3 $g/m^2$. When the thus obtained PS plate is exposed through a transparency to actinic light emitted from a carbon arc lamp, mercury lamp, metal halide lamp, xenon lamp, tungsten lamp or the like, the light-struck areas are rendered alkali-soluble. Therefore, when the exposed plate is processed with the developing solution of the present invention, exposed areas of the light-sensitive layer are dissolved away to lay bare the hydrophilic surface of the support, thus a lithographic printing plate being obtained.

The use of the developing solution of the present invention provides the following advantages: firstly, it raises development stability so much that control of developing conditions becomes extremely easy; secondly, it enhances processing capability so much that many PS plates can be developed with a small amount of the developing solution; and, therefore, thirdly the amount of waste liquor to be discharged is so small that treatment of the waste liquor is easy.

Therefore, the developing solution of the present invention is extremely advantageous when used for developing many PS plates with compensating for the fatigue of a developing solution by adding a replenisher as described in U.S. Pat. No. 4,257,434, BP Laid-Open No. 2,046,931A, and PCT Application Laid-Open No. WO82/01086, as the developing solution or replenisher.

The present invention will now be described in more detail by the following examples of preferred embodiments of the present invention which, however, are not to be construed as limiting the present invention in any way. Additionally, "%"s are by weight unless otherwise specified.

EXAMPLES 1 to 4

0.8 Part by weight of naphthoquinone-1,2-diazido-5-sulfonic acid ester of polyhydroxyphenyl obtained by polycondensation of acetone and pyrogallol, described in Japanese Patent Publication No. 28403/68 corresponding to U.S. Pat. No. 3,635,709, 2.2 parts by weight of novolak type m- and p-cresol mixture-formaldehyde resin, 0.02 part by weight of novolak type octylphenol resin, 0.08 part by weight of phthalic anhydride, 0.04 part by weight of 2-trichloromethyl-5-(p-n-butoxystyryl)-1,3,4-oxadiazole, and 0.03 part by weight of crystal violet p-toluenesulfonate were dissolved in a mixture of 20 parts by weight of methyl cellosolve acetate and 8 parts by weight of methyl ethyl ketone to prepare a light-sensitive solution.

A 0.3-mm thick, nylon brush-grained aluminum plate was etched with alkali, then electrolytically grained in a nitric acid aqueous solution, anodized in a sulfuric acid aqueous solution (the amount of oxide film: 2.7 g/m$^2$), treated with a 70° C. aqueous solution of zinc acetate, washed throughly and dried, and the above-described light-sensitive solution was coated on the thus treated aluminum plate using a whirler to obtain a PS plate having a light-sensitive layer present in an amount of about 2.0 g/m$^2$. This PS plate was exposed through a step wedge having a density difference of 0.15 and a halftone wedge using a 2 kw metal halide lamp.

Separately, developing solutions containing the compounds given in Table 1 in amounts also given there per liter of a 2 wt % aqueous solution of sodium silicate having a SiO$_2$/Na$_2$O molar ratio of about 1.1 were prepared.

TABLE 1

| Example | Additive (amount (g)) | |
|---|---|---|
| 1 | [Co(NH$_3$)$_6$]Cl$_3$ (0.014) | — |
| 2 | CoCl$_2$.6H$_2$O (0.03) | Tetrasodium ethylenediamine-tetraacetate.4H$_2$O (0.10) |
| 3 | Co(CH$_3$COO)$_2$.4H$_2$O (0.05) | Tetrasodium ethylenediamine-tetraacetate.4H$_2$O (0.10) |
| 4 | [Co(NO$_2$)(NH$_3$)$_5$]Cl$_2$ (0.008) | N(CH$_2$COONa)$_3$ (0.08) |
| Comparative Example 1 | None | — |

Two PS plates having been exposed were dipped in each of the developing solutions kept at 25° C., and one plate was taken out after one minute and the other plate after five minutes, then washed with water. Table 2 shows the step numbers of dissolved step wedges and the results of half-tone dot reproducibility of high-light areas of a halftone dot wedge.

TABLE 2

| | Step Number of Step Wedge | | |
|---|---|---|---|
| | 1-Minute Development | 5-minute Development | Halftone Dot Wedge |
| Example | | | |
| 1 | 3 | 4 | 150 Lines/inch, 2% halftone dots were produced by 5-minute development |
| 2 | 3 | 4 | 150 Lines/inch, 2% halftone dots were produced by 5-minute development |
| 3 | 4 | 5 | 150 Lines/inch, 2% halftone dots were produced by 5-minute development |
| 4 | 3 | 4 | 150 Lines/inch, 2% halftone dots were produced by 5-minute development |
| Comparative Example 1 | 6 | 13 | 150 Lines/inch, 5% halftone dots were not reproduced by 5-minute development |

It is seen from the results in Table 2, in comparison with Comparative Example 1 which independently uses a sodium silicate aqueous solution, developing solutions of Examples 1 to 4 show extremely excellent development stability. Further, with respect to development processing capacity, developing solutions of Examples 1 and 2 maintained enough developing ability even after developing 3 m$^2$/liter of PS plates.

EXAMPLES 5 to 15

The same PS plates as used in Example 1 were developed in the same manner as in Example 1 except for using developers containing compounds given in Table 3 in amounts also given there per liter of a 2.5% aqueous solution of potassium silicate having a SiO$_2$/K$_2$O molar ratio of 1.2. The results thus obtained are tabulated in Table 4.

TABLE 3

| Example | Additive amount (g) | |
|---|---|---|
| 5 | [Co(NH$_3$)$_6$]Cl$_3$ (0.01) | — |
| 6 | [Ni(NH$_3$)$_6$]Cl$_2$ (0.01) | — |
| 7 | CoCl$_2$.6H$_2$O (0.035) | Tetrasodium ethylenediamine-tetraacetate.4H$_2$O (0.175) |
| 8 | SnCl$_2$.2H$_2$O (0.02) | Tetrasodium ethylenediamine-tetraacetate.4H$_2$O (0.12) |
| 9 | PbCl$_2$ (0.02) | Tetrasodium ethylenediamine-tetraacetate.4H$_2$O (0.12) |
| 10 | NiCl$_2$.6H$_2$O (0.035) | Tetrasodium ethylenediamine-tetraacetate.4H$_2$O (0.21) |
| 11 | CoCl$_2$.6H$_2$O (0.02) | Sodium trans-cyclohexane-1,2-diaminetetraacetate (0.10) |
| 12 | CoCl$_2$.6H$_2$O (0.04) | Sodium diethylenetriaminepentaacetate (0.28) |
| 13 | [Co(NH$_3$)$_6$]Cl$_3$ (0.1) | Tetrasodium ethylenediamine-tetraacetate.4H$_2$O (1.0) |
| 14 | [Ni(NH$_3$)$_6$](HPO$_4$)$_2$ (0.1) | Tetrasodium ethylenediamine-tetraacetate.4H$_2$O (2.0) |
| 15 | [Co(NH$_2$CH$_2$CH$_2$NH$_2$)$_3$]Cl$_3$ (0.12) | — |
| Comparative Example 1 | None | — |

TABLE 4

| | Step Number of Step Wedge | | |
|---|---|---|---|
| | 1-Minute Development | 5-Minute Development | Halftone Dot Wedge |
| Example | | | |
| 5 | 3 | 4 | 150 Lines/inch, 2% halftone dots were reproduced by 5-minute development |
| 6 | 3 | 4 | 150 Lines/inch, 2% halftone dots were reproduced by 5-minute development |
| 7 | 4 | 5 | 150 Lines/inch, 2% halftone dots were reproduced by 5-minute development |
| 8 | 3 | 4 | 150 Lines/inch, 2% halftone dots were reproduced by 5-minute development |
| 9 | 4 | 5 | 150 Lines/inch, 2% halftone |

TABLE 4-continued

| Step Number of Step Wedge | | |
|---|---|---|
| 1-Minute Development | 5-Minute Development | Halftone Dot Wedge |
| | | dots were reproduced by 5-minute development |
| 10 | 4 | 5 | 150 Lines/inch, 2% halftone dots were reproduced by 5-minute development |
| 11 | 3 | 4 | 150 Lines/inch, 2% halftone dots were reproduced by 5-minute development |
| 12 | 3 | 4 | 150 Lines/inch, 2% halftone dots were reproduced by 5-minute development |
| 13 | 3 | 4 | 150 Lines/inch, 2% halftone dots were reproduced by 5-minute development |
| 14 | 3 | 4 | 150 Lines/inch, 2% halftone dots were reproduced by 5-minute development |
| 15 | 3 | 4 | 150 Lines/inch, 2% halftone dots were reproduced by 5-minute development |
| Comparative Example 2 | 6 | 12 | 150 Lines/inch, 2.5% halftone dots were reproduced by 5-minute development |

It is seen from the results in Table 4 that, in comparison with Comparative Example 2 which independently uses a potassium silicate aqueous solution, developing ability of the developing solutions of the present invention containing the complex or chelate compound is extremely stable. In addition, when a waste liquor of each of the used developing solutions was diluted with the same quantity of water and neutralized with hydrochloric acid, no gelation took place, thus neutralization being conducted with ease.

EXAMPLE 16

When a PS plate containing bisphenol A naphthoquinone-1,2-diazido-5-sulfonic acid ester in place of the naphthoquinonediazide compound used in Example 1 was used, there were obtained the same results as in Example 1.

While the invention has been described in detail and with reference to specific embodiments thereof, it will be apparent to one skilled in the art that various changes and modifications can be made therein without departing from the spirit and scope thereof.

What is claimed is:

1. A method of developing an imagewise exposed light-sensitive printing plate having a light-sensitive layer comprising an o-quinonediazide compound, which comprises the steps of
    (1) imagewise exposing the light-sensitive printing plate to light; and
    (2) developing the plate with a developing solution comprising:
        an aqueous solution wherein all ingredients are in a dissolved state containing alkali silicate and an alkali aqueous solution-soluble ligand forming complex of a metal selected from the group consiting of Co and Ni, said complex being formed by adding a ligand complex compound of a metal selected from the group consisting of Co and Ni and a polydentate ligand as separate ingredients to the aqueous solution,
        whereby exposed areas of the light sensitive layer are removed to form a lithographic printing plate, and
    wherein the alkali silicate molar ratio represented by $SiO_2/M_2O$ (M is an alkali metal or ammonium) is in the range of 0.5 to 3.0; the alkali silicate is present in a concentration in the range of 1 to 10 wt %; and the alkali aqueous solution-soluble complex is present in the aqueous solution in an amount in the range of 0.005 to 0.2 wt % based on the total weight of the developing solution.

2. A method of developing an imagewise exposed light-sensitive printing plate as claimed in claim 1, wherein the o-quinonediazide compound is a o-naphthoquinonediazide compound.

3. A method of developing an imagewise exposed light-sensitive printing plate as claimed in claim 1, wherein the alkali aqueous solution-soluble complex of the metal is a complex compound of aminopolycarboxylic acid and Co.

4. A method of developing an imagewise exposed light-sensitive printing plate as claimed in claim 1, wherein the alkali aqueous solution-soluble complex of the metal is selected from the group consisting of $[Co(NH_3)_6]Cl_3$, $[Ni(NH_3)_6]Cl_2$, $[Co(H_2NCH_2CH_2NH_2)_3]Cl_3$, $[Co(NH_3)_6]PO_4$, $[Co(NH_3)_6](H_2PO_4)_3$, $[Ni(NH_3)_5Cl]Cl$, $[Co(CN)(NH_3)_5]Cl$, $[Co(NO_2)(NH_3)_5]Cl_2$, $[Co(NO_3)(NH_3)_5]Cl_2$, $[Co(SO_3)(NH_3)_5]Cl$, $[Co(NO_2)(NH_3)_5]Cl_2$, $[Co(OH_2)(NH_3)_5]Cl_3$, $K_3[Co(CN)_6]$, $[Co(NH_3)_4Cl_2]Cl_2$, $[Co(CH_3COO)_2]\cdot 4H_2O$, $K[Co(edta)]$, $Na[Co(edta)]$, $(NH_4)[Co(edta)]$, $K_3[CoCl_6]$, $Na_3[CoBr_6]$, $K[Co(H_2NCH_2CH_2CH_2)(NO_2)_4]$, $K_3[Ni(C_2O_4)_3]$, $K_2[Ni(edta)]$, or $Na_2[Ni(edta)]$.

5. A method of developing an imagewise exposed light-sensitive printing plate as claimed in claim 1, wherein the amount of alkali aqueous solution-soluble complex of the metal is 0.01 to 0.1 wt % based on the total weight of the developing solution.

* * * * *